(12) United States Patent
Wu et al.

(10) Patent No.: US 9,581,310 B2
(45) Date of Patent: Feb. 28, 2017

(54) LIGHT-EMITTING MODULE

(71) Applicants: Chien-Jung Wu, New Taipei (TW);
Kuo-Feng Tseng, New Taipei (TW);
Han-Pin Pan, New Taipei (TW)

(72) Inventors: Chien-Jung Wu, New Taipei (TW);
Kuo-Feng Tseng, New Taipei (TW);
Han-Pin Pan, New Taipei (TW)

(73) Assignee: EDISON OPTO CORPORATION, New Taipei (TW)

( * ) Notice: Subject to any disclaimer, the term of this patent is extended or adjusted under 35 U.S.C. 154(b) by 169 days.

(21) Appl. No.: 14/610,433

(22) Filed: Jan. 30, 2015

(65) Prior Publication Data

US 2016/0091172 A1    Mar. 31, 2016

(30) Foreign Application Priority Data

Sep. 26, 2014  (TW) .............................. 103133454 A

(51) Int. Cl.

| | |
|---|---|
| *F21V 9/16* | (2006.01) |
| *H01L 25/075* | (2006.01) |
| *H01L 33/50* | (2010.01) |
| *F21K 99/00* | (2016.01) |
| *F21Y 101/00* | (2016.01) |

(52) U.S. Cl.
CPC ............ *F21V 9/16* (2013.01); *H01L 25/0753* (2013.01); *F21K 9/00* (2013.01); *F21Y 2101/00* (2013.01); *F21Y 2105/10* (2016.08); *F21Y 2115/10* (2016.08); *H01L 33/504* (2013.01); *H01L 2224/48137* (2013.01); *H01L 2924/0002* (2013.01); *H01L 2924/181* (2013.01)

(58) Field of Classification Search
CPC .......... F21V 9/16; F21K 9/00; F21Y 2101/02; F21Y 2105/001; F21Y 2105/005; H01L 25/0753; H01L 33/504
See application file for complete search history.

(56) References Cited

U.S. PATENT DOCUMENTS

2003/0111955 A1\*  6/2003  McNulty .............. H01L 51/5036
                                                      313/504
2010/0171413 A1\*  7/2010  Winkler .............. C09K 11/7794
                                                      313/486

\* cited by examiner

*Primary Examiner* — Joseph L Williams
(74) *Attorney, Agent, or Firm* — Hudak, Shunk & Farine Co. LPA

(57) ABSTRACT

A light-emitting module has better white light color rendering index to provide white rendering effect in accordance with the requirements of various application sites. The light-emitting module includes a (circuit) substrate board and at least one ultraviolet ray emitter and at least one blue light emitter disposed on the substrate board. The light wavelength of the ultraviolet ray emitter ranges from 380 nm to 420 nm. The light wavelength of the blue light emitter ranges from 440 nm to 470 nm. A wavelength conversion layer is laid on the substrate board. The wavelength conversion layer includes a first wavelength conversion material and a second wavelength conversion material for receiving and converting the light emitted from the ultraviolet ray emitter into visible light and the light emitted from the blue light emitter into white light. After the lights are mixed, a white general output optical spectrum is achieved.

22 Claims, 6 Drawing Sheets

LIGHT-EMITTING MODULE

FIELD OF THE INVENTION

The present invention relates generally to a light-emitting module including a combination of ultraviolet ray emitters, blue light emitters and a wavelength conversion layer. The wavelength conversion layer includes a first wavelength conversion material and a second wavelength conversion material for receiving and converting the light emitted from the ultraviolet ray emitter into visible light and the light emitted from the blue light emitter into white light. After the lights are mixed, a pure snow white light is output.

BACKGROUND OF THE INVENTION

A conventional light-emitting diode (LED) is used as a light source or illumination device. The LED is widely applied to various sites or environments. In conventional technique, a light-emitting module is often used to project white light onto an exhibited environment or product. The light-emitting module includes blue light LED. The light emitted from the blue light LED energizes yellow fluorescent powder or phosphor to produce white light emitting module. Also, red, blue and green LED can be combined into a white light emitting module.

In conventional technique, a wavelength conversion material (such as fluorescent powder or phosphor with a wavelength ranging from 500 nm to 780 nm) is disposed on blue light LED with a wavelength ranging from 440 nm to 460 nm. The wavelength conversion material serves to convert the light emitted from the blue light LED into colored light of green to red. The colored light is mixed with the light emitted from a deep blue light LED with a light wavelength ranging from 400 nm to 440 nm to achieve a white light output effect.

In the above technique, the wavelength conversion material converts the light emitted from the blue light LED into colored light of green to red. The colored light is mixed with the deep blue light emitted from the deep blue light LED with a certain wavelength or short wavelength to achieve a white output light. The light emitted from the deep blue light LED is not converted by the wavelength conversion material to change the wavelength. Moreover, the light emitted from the deep blue light LED is not a normal blue light so that the light-emitting module as a whole can output the white light.

With respect to the structure and application of the conventional white light emitting module, the conventional technique cannot adjust the white light rendering effect according to the product attribute, environment or application condition. The conventional technique cannot solve the problem of non-uniform mixing of the light.

It is therefore tried by the applicant to provide a light-emitting module in which the combination of the LED and the wavelength conversion material is redesigned in use form and structure to distinguish the light-emitting module from the conventional technique and improve the application thereof and enhance the white light rendering effect. Also, the light-emitting module of the present invention minimizes the possibility that the light is non-uniformly mixed as happening in the conventional technique.

SUMMARY OF THE INVENTION

It is therefore a primary object of the present invention to provide a light-emitting module, which has better white light color rendering index, whereby the waveform of the light of the LED is approximate to the waveform of a conventional halogen lamp so as to meet the requirement of white color rendering effect expected in many application situations. The light-emitting module includes a (circuit) substrate board and at least one ultraviolet ray emitter and at least one blue light emitter disposed on the substrate board. The light wavelength of the ultraviolet ray emitter ranges from 380 nm to 420 nm. The light wavelength of the blue light emitter ranges from 440 nm to 470 nm. A wavelength conversion layer is laid on the substrate board. The wavelength conversion layer includes a first wavelength conversion material and a second wavelength conversion material. The first wavelength conversion material serves to receive and energize the light emitted from the ultraviolet ray emitter into visible light and the second wavelength conversion material serves to receive and convert the light emitted from the blue light emitter into white light. After the lights are mixed, a white general output optical spectrum is achieved.

In the above light-emitting module, the ultraviolet ray emitter is an ultraviolet ray emitting diode, while the blue light emitter is a blue light emitting diode. The first wavelength conversion material of the wavelength conversion layer is mixed with the second wavelength conversion material to form a mixture. The mixture is disposed on or encloses the ultraviolet ray emitter and the blue light emitter. The first wavelength conversion material includes at least one UV fluorescent material and the second wavelength conversion material includes at least one fluorescent material. The first wavelength conversion material serves to convert or energize the light emitted from the ultraviolet ray emitter into an expected visible light (such as a colored light with color temperature ranging from 2000K to 18000K). The second wavelength conversion material serves to convert or energize the light emitted from the blue light emitter into an expected visible light (such as a colored light with color temperature ranging from 2000K to 18000K).

In the above light-emitting module, the ultraviolet ray emitter is an ultraviolet ray emitting diode, while the blue light emitter is a blue light emitting diode. The first wavelength conversion material of the wavelength conversion layer forms a first wavelength conversion layer. The second wavelength conversion material forms a second wavelength conversion layer. The first and second wavelength conversion layers are overlapped with each other to form a laminated structure. The laminated structure is disposed on the ultraviolet ray emitter and the blue light emitter or positioned in a position spaced from the ultraviolet ray emitter and the blue light emitter by a predetermined height.

BRIEF DESCRIPTION OF THE DRAWINGS

The present invention can be best understood through the following description and accompanying drawings, wherein.

DETAILED DESCRIPTION OF THE PREFERRED EMBODIMENTS

Figure 1:
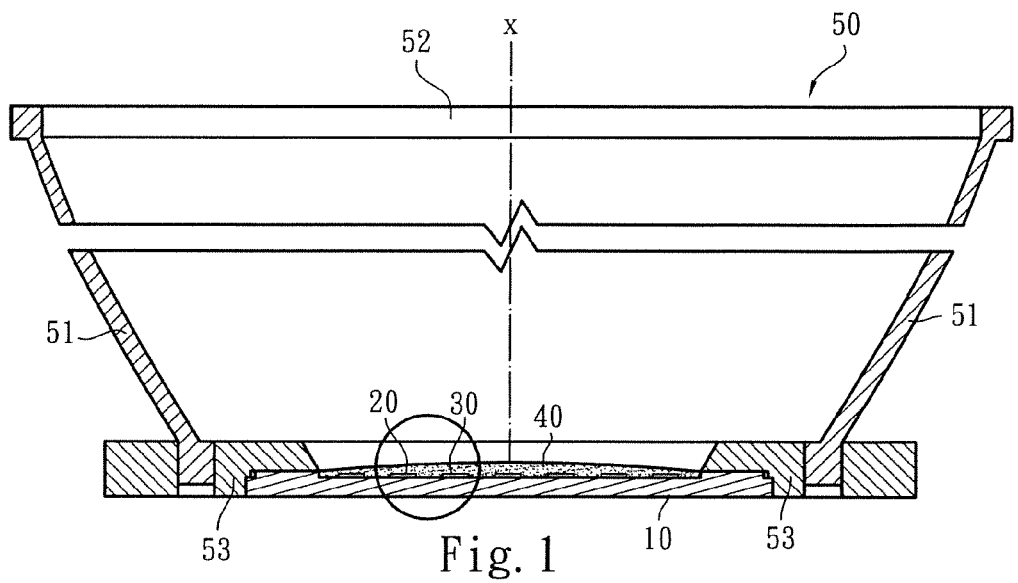
FIG. 1 is a sectional view showing that the light-emitting module of the present invention is assembled with a light guide.
Figure 2:
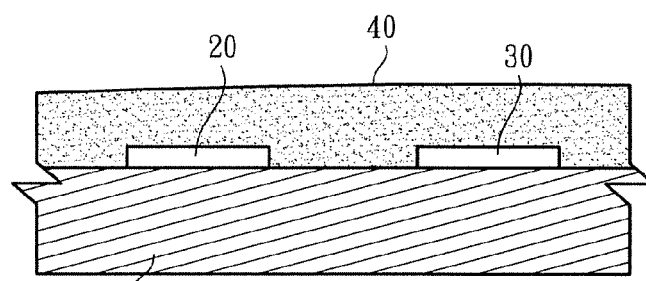
FIG. 2 is an enlarged view of circled area of FIG. 1, showing the assembly of the ultraviolet ray emitter, the blue light emitter, the wavelength conversion layer and the substrate board of the present invention.
Figure 3:
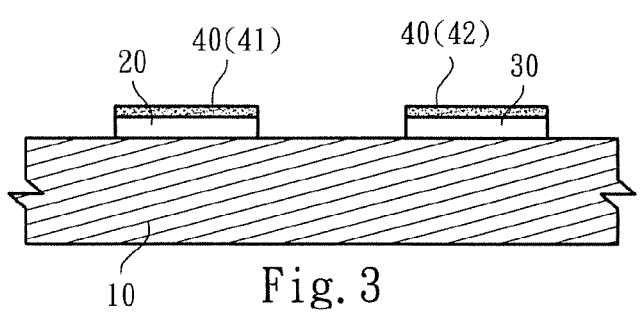
FIG. 3 is a sectional view of a preferred embodiment of the present invention, showing that two wavelength conversion layers are respectively disposed on the ultraviolet ray emitter and the blue light emitter.

Please refer to FIGS. 1, 2 and 3. The light-emitting module of the present invention includes a substrate board 10 in a geometrical form. The substrate board 10 is selected from a group consisting of an electro-conductive and heat conduction metal substrate board (such as copper substrate board or aluminum substrate board), circuit board and ceramic substrate board. At least one ultraviolet ray emitter 20 and at least one blue light emitter 30 are disposed on the substrate board 10. The ultraviolet ray emitter 20 is selectively an ultraviolet ray emitting diode with a light wavelength or optical spectrum ranging from 380 nm to 420 nm. The blue light emitter 30 is selectively a blue light emitting diode with a light wavelength or optical spectrum ranging from 440 nm to 470 nm. A wavelength conversion layer 40 is laid on the substrate board 10 to at least receive the light emitted from the ultraviolet ray emitter 20 and the blue light emitter 30. The wavelength conversion layer 40 further energizes the light emitted from the ultraviolet ray emitter to produce a visible light and converts the light emitted from the blue light emitter into white light. After mixing the light, a white general output optical spectrum is achieved.

Please refer to FIGS. 1 and 2. In this embodiment, the wavelength conversion layer 40 includes a first wavelength conversion material and a second wavelength conversion material. The first wavelength conversion material converts or energizes the ultraviolet ray emitter 20 to produce an expected visible light (such as a colored light with color temperature ranging from 2000K to 18000K). The second wavelength conversion material converts or energizes the blue light emitter 30 to produce an expected visible light (such as a colored light with color temperature ranging from 2000K to 18000K). The wavelength conversion layer 40 includes at least one fluorescent material (such as fluorescent powder, fluorescent agent or phosphor) and/or a combination of multiple colored UV fluorescent materials such as green, yellow and red fluorescent powders.

Therefore, the first wavelength conversion material of the wavelength conversion layer 40 includes at least one UV fluorescent material (such as UV fluorescent powder, UV fluorescent agent or UV phosphor) or a combination of multiple colored UV fluorescent materials and is able to convert the light emitted from the ultraviolet ray emitter 20 into white light or other colored light (such as visible light of green to red or colored light with a wavelength ranging from 500 nm to 660 nm). The second wavelength conversion material of the wavelength conversion layer 40 includes at least one fluorescent material to convert the light emitted from the blue light emitter 30 into white light. Accordingly, the light-emitting module as a whole can achieve a white general output optical spectrum.

Preferably, the wavelength range of the above visible light includes two main bands of green visible light ranging from 520 nm to 560 nm and red (orange) visible light ranging from 610 nm to 650 nm.

FIG. 2 shows that the first wavelength conversion material of the wavelength conversion layer 40 is mixed with the second wavelength conversion material. The wavelength conversion layer 40 is disposed or encloses the ultraviolet ray emitter 20 and the blue light emitter 30. It should be noted that the wavelength conversion layer 40 can be alternatively positioned in a position spaced from the ultraviolet ray emitter 20 and the blue light emitter 30 by a predetermined height.

Figure 2A:
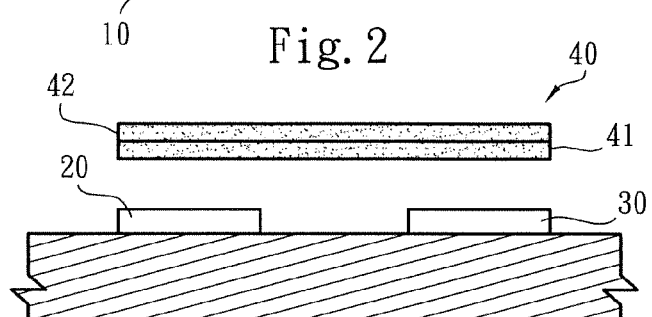
FIG. 2A is a sectional view of a preferred embodiment of the present invention, showing that the wavelength conversion layer is positioned in a position spaced from the ultraviolet ray emitter and the blue light emitter by a predetermined height.

Please now refer to FIGS. 2A and 3. In a preferred embodiment, the first wavelength conversion material of the wavelength conversion layer 40 forms a first wavelength conversion layer 41, while the second wavelength conversion material of the wavelength conversion layer 40 forms a second wavelength conversion layer 42. FIG. 2A shows that the first and second wavelength conversion layers 41, 42 are overlapped with each other to form a laminated structure. The laminated structure is positioned in a position spaced from the ultraviolet ray emitter 20 and the blue light emitter 30 by a predetermined height (or disposed on the ultraviolet ray emitter 20 and the blue light emitter 30). FIG. 3 shows that the first wavelength conversion layer 41 is disposed on the ultraviolet ray emitter 20, while the second wavelength conversion layer 42 is disposed on the blue light emitter 30. (Alternatively, the first and second wavelength conversion layers, 41, 42 are respectively positioned in a position spaced from the ultraviolet ray emitter 20 and the blue light emitter 30 by a predetermined height).

Therefore, the ultraviolet ray emitted from the ultraviolet ray emitter 20 energizes the UV fluorescent material of the first wavelength conversion layer 41 and is converted into white light or visible light of green to red, (for example, colored light with a wavelength ranging from 500 nm to 660 nm). The second wavelength conversion layer 42 mainly contains yellow fluorescent powder. The blue light emitted from the blue light emitter 30 energizes the second wavelength conversion layer 42 and is converted into white output light. The white output light is mixed with the white light or visible light of green to red converted from the ultraviolet ray of the ultraviolet ray emitter 20 and output. Accordingly, the light-emitting module has better white light color rendering index.

It can be known from FIGS. 2, 2A and 3 that the wavelength conversion layer 40 of FIG. 2 is a composition of at least one fluorescent material and at least one UV fluorescent material. The wavelength conversion layer 40 of FIG. 2A is a laminated structure with at least two layers, (that is, the first and second wavelength conversion layers 41, 42). In FIG. 3, the first and second wavelength conversion layers 41, 42 are respectively disposed on the ultraviolet ray emitter 20 and the blue light emitter 30.

Figure 3A:
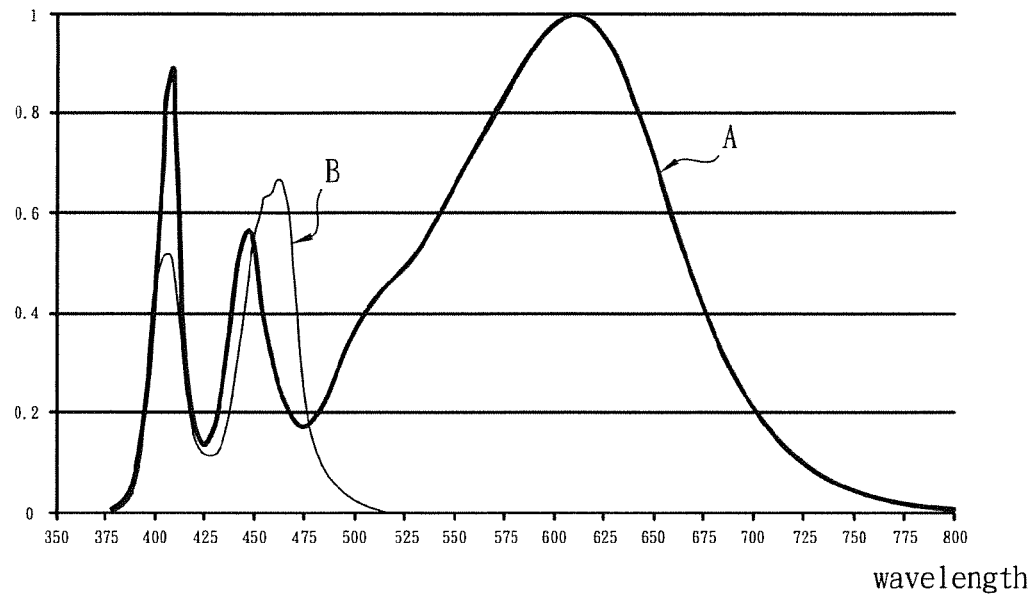
FIG. 3A is a diagram of an optical spectrum of the light-emitting module of the present invention, showing the light wavelength output range of the combination of the ultraviolet ray emitter, the blue light emitter and the wavelength conversion layer.

FIG. 3A is a diagram of an optical spectrum of the light-emitting module of the present invention, showing the light wavelength output range of the combination of the ultraviolet ray emitter, the blue light emitter and the wavelength conversion layer. FIG. 3A shows that the first wavelength conversion material or the first wavelength conversion layer 41 employs blue light UV fluorescent material. The transverse axis is the wavelength (nm), while the longitudinal axis is the intensity. The optical spectrum A of FIG. 3A shows the light wavelength output range of the combination of the blue light emitter 30 and the second wavelength conversion layer 42. The optical spectrum B of FIG. 3A shows the light wavelength output range of the combination of the ultraviolet ray emitter 20 and the first wavelength conversion material or first wavelength conversion layer 41. Therefore, the ultraviolet ray emitter 20 and the first wavelength conversion material (or first wavelength conversion layer 41) enhance the blue light output amount.

Figure 3B:
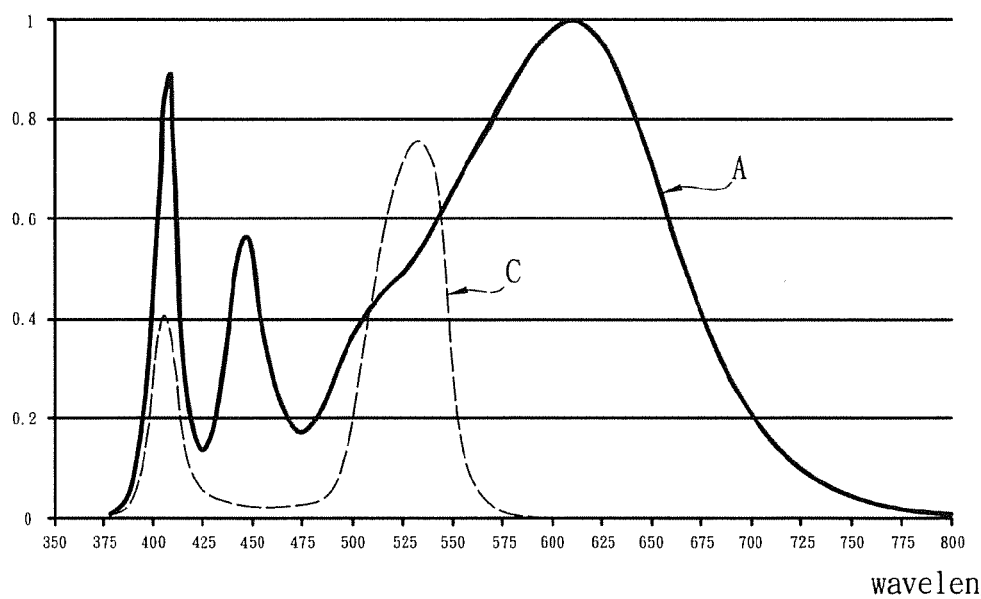
FIG. 3B is a diagram of another optical spectrum of the light-emitting module of the present invention, showing the light wavelength output range of the combination of the ultraviolet ray emitter, the blue light emitter and the wavelength conversion layer.

FIG. 3B shows that the first wavelength conversion material or the first wavelength conversion layer 41 employs green light UV fluorescent material. The optical spectrum A of FIG. 3B shows the light wavelength output range of the combination of the blue light emitter 30 and the second wavelength conversion layer 42. The optical spectrum C of FIG. 3B shows the light wavelength output range of the combination of the ultraviolet ray emitter 20 and the first wavelength conversion material or first wavelength conversion layer 41. Therefore, the ultraviolet ray emitter 20 and the first wavelength conversion material (or first wavelength conversion layer 41) enhance the green light output amount.

Figure 3C:
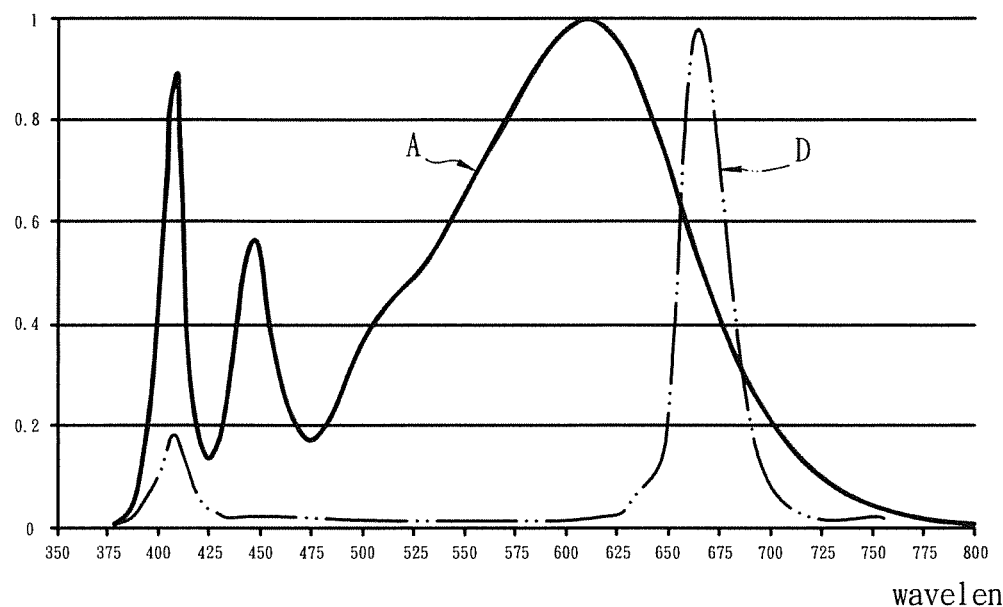
FIG. 3C is a diagram of still another optical spectrum of the light-emitting module of the present invention, showing the light wavelength output range of the combination of the ultraviolet ray emitter, the blue light emitter and the wavelength conversion layer.

FIG. 3C shows that the first wavelength conversion material or the first wavelength conversion layer 41 employs red light UV fluorescent material. The optical spectrum A of FIG. 3C shows the light wavelength output range of the combination of the blue light emitter 30 and the second wavelength conversion layer 42. The optical spectrum D of FIG. 3C shows the light wavelength output range of the combination of the ultraviolet ray emitter 20 and the first wavelength conversion material or first wavelength conversion layer 41. Therefore, the ultraviolet ray emitter 20 and the first wavelength conversion material (or first wavelength conversion layer 41) enhance the red light output amount.

Figure 3D:
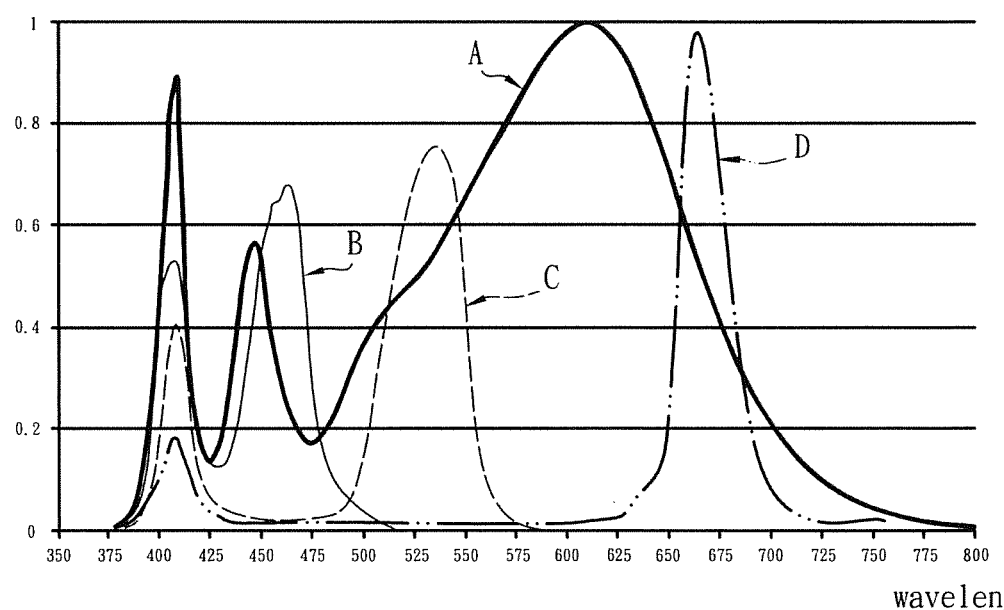
FIG. 3D is a diagram of still another optical spectrum of the light-emitting module of the present invention, showing the light wavelength output range of the combination of the ultraviolet ray emitter, the blue light emitter and the wavelength conversion layer.

FIG. 3D is a diagram of another optical spectrum of the light-emitting module of the present invention, showing the light wavelength output range of the combination of the ultraviolet ray emitter, the blue light emitter and the wavelength conversion layer. FIG. 3D shows that the first wavelength conversion material or the first wavelength conversion layer 41 contains blue light UV fluorescent material, green light UV fluorescent material and red light UV fluorescent material. The optical spectrum A of FIG. 3D shows the light wavelength output range of the combination of the blue light emitter 30 and the second wavelength conversion layer 42. The optical spectrum B of FIG. 3D shows the blue light wavelength output range achieved by that the light emitted from the ultraviolet ray emitter 20 energizes the blue light UV fluorescent material of the first wavelength conversion material or the first wavelength conversion layer 41. The optical spectrum C of FIG. 3D shows the green light wavelength output range achieved by that the light emitted from the ultraviolet ray emitter 20 energizes the green light UV fluorescent material of the first wavelength conversion material or the first wavelength conversion layer 41. The optical spectrum D of FIG. 3D shows the red light wavelength output range achieved by that the light emitted from the ultraviolet ray emitter 20 energizes the red light UV fluorescent material of the first wavelength conversion material or the first wavelength conversion layer 41.

Figure 3E:
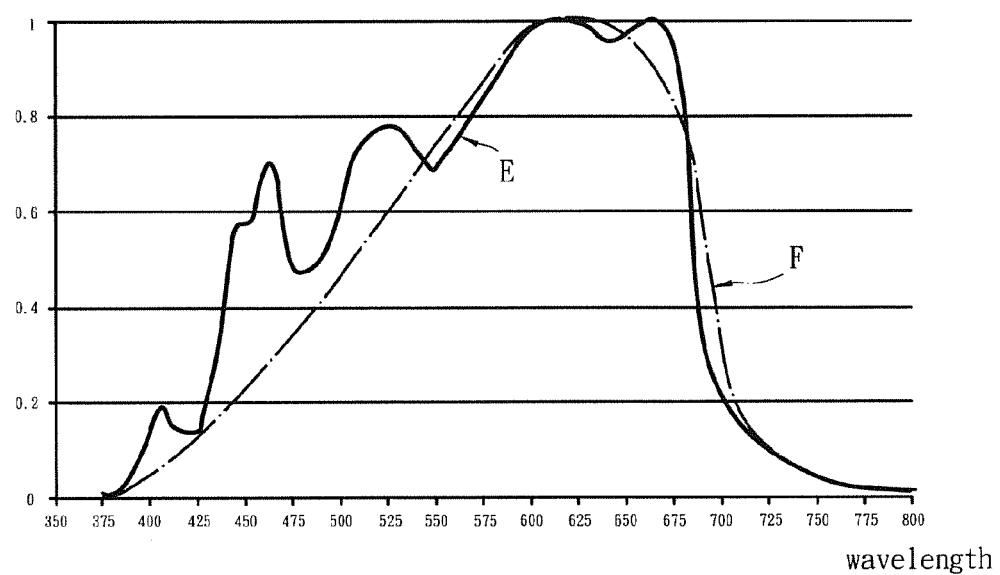
FIG. 3E is a diagram of an optical spectrum of the light-emitting module of the present invention, showing the light wavelength output range of the combination of the ultraviolet ray emitter, the blue light emitter and the wavelength conversion layer and showing an optical spectrum of a halogen lamp.

Please now refer to FIG. 3E. The optical spectrums A, B, C and D together achieve the light wavelength output range of the optical spectrum E. It is also shown in the drawing that the range of the optical spectrum E is close to the range of the optical spectrum F of a halogen lamp. Therefore, it is known that the combination of the ultraviolet ray emitter 20, the blue light emitter 30 and the wavelength conversion layer 40 (such as the first and second wavelength conversion materials or the first and second wavelength conversion layers 41, 42) can be used to achieve the white light rendering effect as a halogen lamp. This is obviously advantageous over the white light output effect of the conventional technique.

Please refer to FIGS. 1, 2 and 3. The substrate board 10 is disposed on the bottom section 53 of a light guide 50. The light guide 50 is an optical reflection member including a reflection wall 51 and an opening 52 (or light emission opening) connected with the reflection wall 51. The reflection wall 51 is a reflection layer with reflection material. For example, the reflection layer can be a metal surface reflection layer or a texture/structure of other material with reflection effect. The reflection wall 51 has a bowl-shaped form, a parabolic form or other geometrical form on the basis of a reference axis $\chi$.

In a preferred embodiment, the wavelength conversion layer 40 is positioned in a position spaced from the ultraviolet ray emitter 20 and/or the blue light emitter 30 by a predetermined height, for example, positioned at the opening 52 of the light guide 50.

Figure 4:
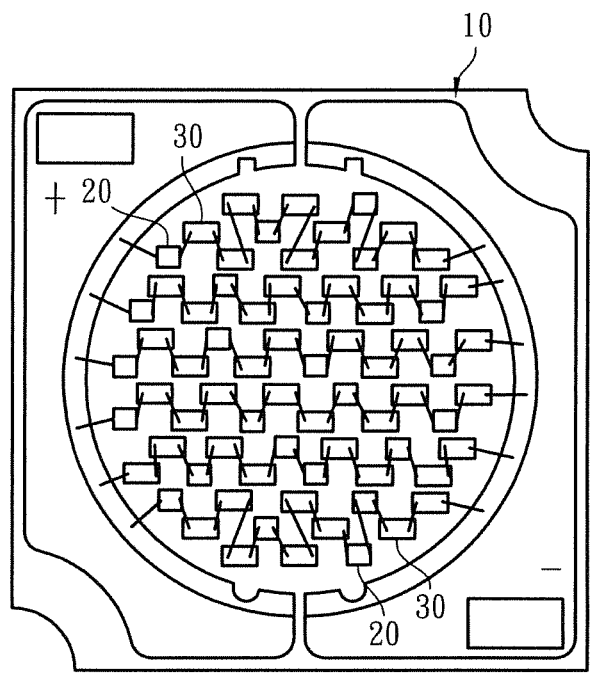
FIG. 4 is a top view of a modified embodiment of the present invention, showing that multiple ultraviolet ray emitters and multiple blue light emitters are arranged on the substrate board.
Figure 5:
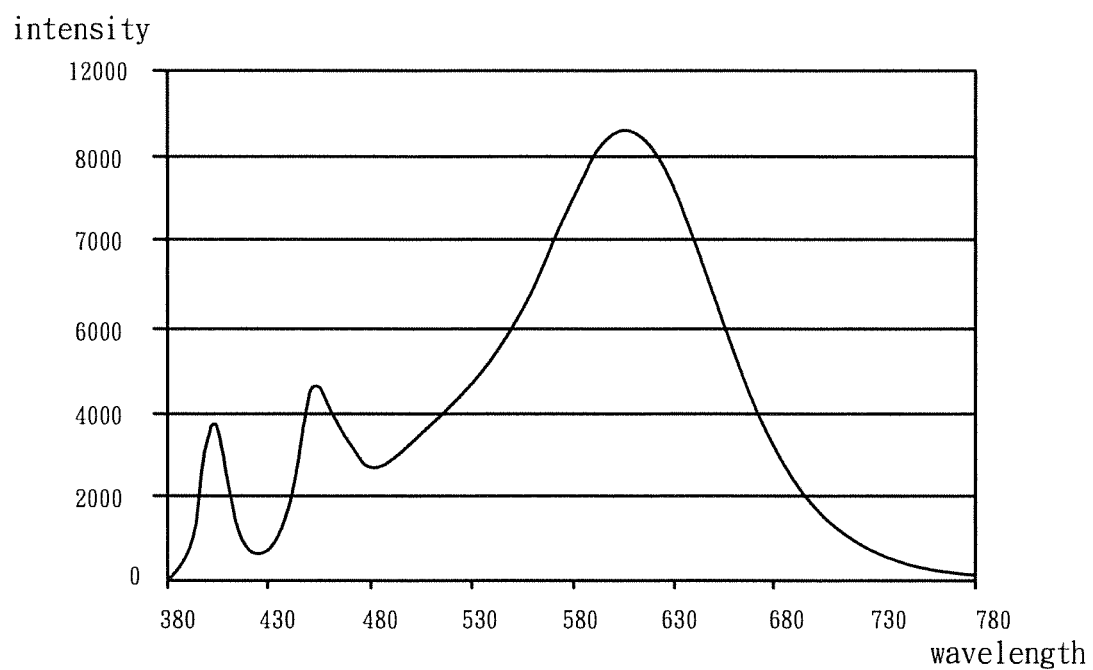
FIG. 5 is a diagram of an optical spectrum of the light-emitting module of the present invention.

Please refer to FIG. 4. Multiple ultraviolet ray emitters 20 and multiple blue light emitters 30 are arranged on the substrate board 10 and electrically connected with each other in series and/or in parallel to together form a light-emitting module with lighting streams. The ratio of the ultraviolet ray emitters 20 to the blue light emitters 30 is 1:2. FIG. 5 shows the optical spectrum output from the light-emitting module. That is, through tested, it is found that the color rendering index (CRI) of the embodiment of the light-emitting module is up to 80.

Figure 6:
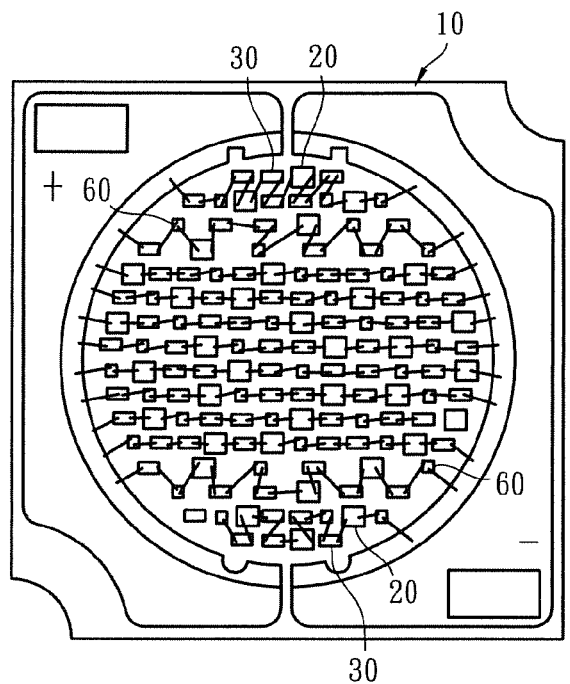
FIG. 6 is a top view of another modified embodiment of the present invention, showing that multiple ultraviolet ray emitters, multiple blue light emitters and multiple subsidiary light emitters are arranged on the substrate board.
Figure 7:
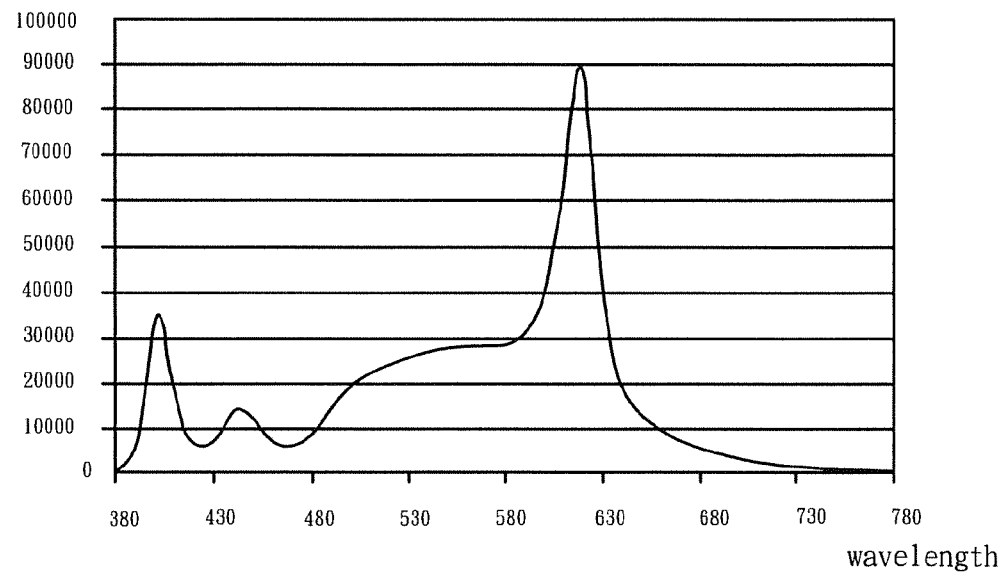
FIG. 7 is a diagram of an optical spectrum of the embodiment of FIG. 6.

Please refer to FIG. 6. In a modified embodiment of the present invention, multiple ultraviolet ray emitters 20, multiple blue light emitters 30 and multiple subsidiary light emitters 60 are arranged on the substrate board 10 and electrically connected with each other in series to together form a light-emitting module with lighting streams. The subsidiary light emitter 60 is selectively a red light emitting diode (or green light emitting diode or blue light emitting diode). The light wavelength or the optical spectrum of the subsidiary light emitter 60 ranges from 610 nm to 650 nm (or 500 nm to 580 nm or 450 nm to 500 nm). Accordingly, as a whole, the color rendering index of the light-emitting module is as increased as possible and the original color rendering effect of white article is enhanced as shown by the optical spectrum of FIG. 7. That is, the color rendering index of the embodiment of the light-emitting module of FIG. 6 is up to 90.

It should be noted that the subsidiary light emitter 60 can includes an assembly of red light emitting diode, green light emitting diode and blue light emitting diode to mix the light and output white light. The subsidiary light emitter 60 can be also combined with a wavelength conversion layer 40 to receive the light emitted from the subsidiary light emitter 60 and convert the light into white light or visible light of green to red.

In a modified embodiment, only multiple ultraviolet ray emitters 20 are arranged on the substrate board 10 and the wavelength conversion layer 40 includes at least three UV fluorescent materials (or UV fluorescent powder, UV fluorescent agent or UV phosphor). The UV fluorescent material can be selectively red light, green light or blue light UV fluorescent powder. The light emitted from the ultraviolet ray emitters 20 will respectively energize the red light, green light and blue light fluorescent materials of the wavelength conversion layer 40 to convert the light into red light, green light and blue light and mix the red light, green light and blue light into white light and output the white light.

In the above modified embodiment, in the case that the wavelength conversion layer 40 is disposed or encloses some of the ultraviolet ray emitters 20, while the rest of the ultraviolet ray emitters 20 are free from the wavelength conversion layer 40 to directly emit ultraviolet ray, then the ultraviolet ray emitters 20 with the wavelength conversion layer 40 will energize and emit white light composed of red light, green light and blue light. The white light is mixed with the ultraviolet ray emitted from the other ultraviolet ray emitters 20 and output.

In comparison with the conventional technique, the light-emitting module of the present invention provides white light output effect and has the following advantages:

The light-emitting module and the relevant components of the present invention are redesigned in use, structure and connection relationship. For example, the ultraviolet ray emitter 20, the blue light emitter 30 and the wavelength conversion layer 40 are combined, whereby the light emitted from the ultraviolet ray emitter 20 and the blue light emitter 30 will respectively energize the first wavelength conversion material (the first wavelength conversion layer 41) containing the UV fluorescent powder and the second wavelength conversion material (the second wavelength conversion layer 42) containing the UV fluorescent powder. The light guide 10 is disposed on the substrate board 10. The light-emitting module of the present invention is different from the combination structure of the conventional LED and wavelength conversion material. The light-emitting module of the present invention is also changed in use form and application range to apparently enhance the white light rendering effect. Accordingly, the light-emitting module of the present invention minimizes the possibility that the light is non-uniformly mixed as happening in the conventional technique.

Especially, it can be known from FIGS. 3A to 3E that the light-emitting module of the present invention is able to output white light and enhance the color rendering effect to improve the problem of the conventional technique that the white light rendering effect or wavelength output range cannot be adjusted according to the product attribute, environment or application condition.

In conclusion, the present invention provides an effective and novel light-emitting module, which is distinguished from the conventional technique in characteristic and advantageous over the conventional technique.

The above embodiments are only used to illustrate the present invention, not intended to limit the scope thereof. Many modifications of the above embodiments can be made without departing from the spirit of the present invention.

What is claimed is:

1. A light-emitting module comprising:
a substrate board; and
at least one ultraviolet ray emitter and at least one blue light emitter disposed on the substrate board, the light wavelength of the ultraviolet ray emitter ranging from 380 nm to 420 nm, the light wavelength of the blue light emitter ranging from 440 nm to 470 nm, a wavelength conversion layer being arranged in the light path of the ultraviolet ray emitter and the blue light emitter, the wavelength conversion layer having a first wavelength conversion material and a second wavelength conversion material, the first wavelength conversion material including at least one UV fluorescent material, the second wavelength conversion material including at least one fluorescent material, the first wavelength conversion material receiving the light emitted from the ultraviolet ray emitter and converting the light into a colored light with color temperature ranging from 2000K to 18000K, the second wavelength conversion material receiving and energizing the light emitted from the blue light emitter and converting the light into a colored light with color temperature ranging from 2000K to 18000K, after the lights are mixed, a white light general output optical spectrum being achieved.

2. The light-emitting module as claimed in claim 1, wherein the ultraviolet ray emitter is an ultraviolet ray emitting diode and the blue light emitter is a blue light emitting diode, the first wavelength conversion material including at least one of blue light UV fluorescent material, green light UV fluorescent material and red light UV fluorescent material, the second wavelength conversion material including at least one of yellow light UV fluorescent material, green light UV fluorescent material and red light UV fluorescent material.

3. The light-emitting module as claimed in claim 1, wherein the first wavelength conversion material is mixed with the second wavelength conversion material to form a mixture disposed on the ultraviolet ray emitter and the blue light emitter or the wavelength conversion layer is positioned in a position spaced from the ultraviolet ray emitter and the blue light emitter by a height.

4. The light-emitting module as claimed in claim 1, wherein the first wavelength conversion material of the wavelength conversion layer forms a first wavelength conversion layer and the second wavelength conversion material of the wavelength conversion layer forms a second wavelength conversion layer, the first and second wavelength conversion layers being overlapped with each other to form a laminated structure, the first and second wavelength conversion layers being disposed on the ultraviolet ray emitter and the blue light emitter or the first and second wavelength conversion layers being positioned in a position spaced from the ultraviolet ray emitter and the blue light emitter by a height.

5. The light-emitting module as claimed in claim 1, wherein the first wavelength conversion material of the wavelength conversion layer forms a first wavelength conversion layer and the second wavelength conversion material of the wavelength conversion layer forms a second wavelength conversion layer, the first wavelength conversion layer being disposed on the ultraviolet ray emitter or positioned in a position spaced from the ultraviolet ray emitter by a height, the second wavelength conversion layer being disposed on the blue light emitter or positioned in a position spaced from the blue light emitter by a height.

6. The light-emitting module as claimed in claim 1, wherein the first wavelength conversion material of the wavelength conversion layer converts the light emitted from the ultraviolet ray emitter into a colored light, the colored light being one of white light and visible light of green to red with a light wavelength ranging from 500 nm to 660 nm, and the second wavelength conversion material of the wavelength conversion layer converts the light emitted from the blue light emitter into white light and outputs the white light.

7. The light-emitting module as claimed in claim 3, wherein the first wavelength conversion material of the wavelength conversion layer converts the light emitted from the ultraviolet ray emitter into a colored light, the colored light being one of white light and visible light of green to red with a light wavelength ranging from 500 nm to 660 nm, and the second wavelength conversion material of the wavelength conversion layer converts the light emitted from the blue light emitter into white light and outputs the white light.

8. The light-emitting module as claimed in claim 4, wherein the first wavelength conversion material of the wavelength conversion layer converts the light emitted from the ultraviolet ray emitter into a colored light, the colored light being one of white light and visible light of green to red with a light wavelength ranging from 500 nm to 660 nm, and the second wavelength conversion material of the wavelength conversion layer converts the light emitted from the blue light emitter into white light and outputs the white light.

9. The light-emitting module as claimed in claim 5, wherein the first wavelength conversion material of the wavelength conversion layer converts the light emitted from the ultraviolet ray emitter into a colored light, the colored light being one of white light and visible light of green to red with a light wavelength ranging from 500 nm to 660 nm, and the second wavelength conversion material of the wavelength conversion layer converts the light emitted from the blue light emitter into white light and outputs the white light.

10. The light-emitting module as claimed in claim 1, wherein the first wavelength conversion material of the wavelength conversion layer converts the light emitted from the ultraviolet ray emitter into colored light, the light wavelength range of the colored light including two bands of green visible light ranging from 520 nm to 560 nm and red visible light ranging from 610 nm to 650 nm.

11. The light-emitting module as claimed in claim 3, wherein the first wavelength conversion material of the wavelength conversion layer converts the light emitted from the ultraviolet ray emitter into colored light, the light wavelength range of the colored light including two bands of green visible light ranging from 520 nm to 560 nm and red visible light ranging from 610 nm to 650 nm.

12. The light-emitting module as claimed in claim 4, wherein the first wavelength conversion material of the wavelength conversion layer converts the light emitted from the ultraviolet ray emitter into colored light, the light wavelength range of the colored light including two bands of green visible light ranging from 520 nm to 560 nm and red visible light ranging from 610 nm to 650 nm.

13. The light-emitting module as claimed in claim 5, wherein the first wavelength conversion material of the wavelength conversion layer converts the light emitted from the ultraviolet ray emitter into colored light, the light wavelength range of the colored light including two bands of green visible light ranging from 520 nm to 560 nm and red visible light ranging from 610 nm to 650 nm.

14. The light-emitting module as claimed in claim 1, wherein the ultraviolet ray emitter is combined with the first wavelength conversion material and the blue light emitter is combined with the second wavelength conversion material to together achieve an optical spectrum, the range of the optical spectrum being identical to the range of the optical spectrum of a halogen lamp.

15. The light-emitting module as claimed in claim 3, wherein the ultraviolet ray emitter is combined with the first wavelength conversion material and the blue light emitter is combined with the second wavelength conversion material to together achieve an optical spectrum, the range of the optical spectrum being identical to the range of the optical spectrum of a halogen lamp.

16. The light-emitting module as claimed in claim 4, wherein the ultraviolet ray emitter is combined with the first wavelength conversion material and the blue light emitter is combined with the second wavelength conversion material to together achieve an optical spectrum, the range of the optical spectrum being identical to the range of the optical spectrum of a halogen lamp.

17. The light-emitting module as claimed in claim 5, wherein the ultraviolet ray emitter is combined with the first wavelength conversion material and the blue light emitter is combined with the second wavelength conversion material to together achieve an optical spectrum, the range of the optical spectrum being identical to the range of the optical spectrum of a halogen lamp.

18. The light-emitting module as claimed in claim 1, wherein the substrate board is selected from a group consisting of a metal substrate board, a circuit board and a ceramic substrate board, the substrate board being disposed on a bottom section of a light guide, the light guide being an optical reflection member including a reflection wall and an opening connected with the reflection wall, the reflection wall being a reflection layer with reflection material, the reflection wall having a geometrical form on the basis of a reference axis.

19. The light-emitting module as claimed in claim 2, wherein multiple ultraviolet ray emitters and multiple blue light emitters are arranged on the substrate board and electrically connected with each other in series or in parallel or in both series and parallel to together form a light-emitting module with lighting streams.

20. The light-emitting module as claimed in claim 3, wherein multiple ultraviolet ray emitters and multiple blue light emitters are arranged on the substrate board and electrically connected with each other in series or in parallel or in both series and parallel to together form a light-emitting module with lighting streams.

21. The light-emitting module as claimed in claim 4, wherein multiple ultraviolet ray emitters and multiple blue light emitters are arranged on the substrate board and electrically connected with each other in series or in parallel or in both series and parallel to together form a light-emitting module with lighting streams.

22. The light-emitting module as claimed in claim 5, wherein multiple ultraviolet ray emitters and multiple blue light emitters are arranged on the substrate board and electrically connected with each other in series or in parallel or in both series and parallel to together form a light-emitting module with lighting streams.

* * * * *